United States Patent
Akai

(10) Patent No.: US 8,546,877 B2
(45) Date of Patent: Oct. 1, 2013

(54) SEMICONDUCTOR DEVICE

(75) Inventor: Kazumasa Akai, Gunma (JP)

(73) Assignees: Semiconductor Components Industries, LLC, Phoenix, AZ (US); SANYO Semiconductor Co., Ltd., Gunma (JP)

( * ) Notice: Subject to any disclaimer, the term of this patent is extended or adjusted under 35 U.S.C. 154(b) by 1266 days.

(21) Appl. No.: 11/861,829

(22) Filed: Sep. 26, 2007

(65) Prior Publication Data
US 2008/0079073 A1    Apr. 3, 2008

(30) Foreign Application Priority Data
Sep. 29, 2006   (JP) ................................. 2006-268227

(51) Int. Cl.
*H01L 29/66* (2006.01)

(52) U.S. Cl.
USPC ............. 257/335; 257/E29.066; 257/E29.256

(58) Field of Classification Search
USPC ................................................. 438/335, 339
See application file for complete search history.

(56) References Cited

U.S. PATENT DOCUMENTS

| | | | | |
|---|---|---|---|---|
| 6,359,318 B1* | 3/2002 | Yamamoto et al. | ............ | 257/378 |
| 2003/0168698 A1* | 9/2003 | Shin et al. | ...................... | 257/335 |
| 2006/0186467 A1* | 8/2006 | Pendharkar et al. | .......... | 257/337 |
| 2006/0226499 A1* | 10/2006 | Shimizu | ....................... | 257/409 |

FOREIGN PATENT DOCUMENTS

| | | |
|---|---|---|
| JP | 3-261176 | 11/1991 |
| JP | 7-7094 | 1/1995 |
| JP | 9-213947 | 8/1997 |
| JP | 10-284731 | 10/1998 |
| JP | 2002-26314 | 1/2002 |
| JP | 2002-198438 | 7/2002 |
| JP | 2004-039774 | 2/2004 |
| JP | 2004-253454 | 9/2004 |

* cited by examiner

*Primary Examiner* — Jenny L Wagner
*Assistant Examiner* — Mark Tornow
(74) *Attorney, Agent, or Firm* — Morrison & Foerster LLP

(57) ABSTRACT

A transistor structure that improves an ESD withstand voltage is offered. There is formed a P-type insulating isolation layer that divides an N-type epitaxial layer into a plurality of regions and isolates neighboring regions from each other. A diffusion layer doped with high concentration N-type impurities and an electrode extraction layer are formed in a surface of the epitaxial layer between a low impurity concentration drain layer and the insulating isolation layer. The diffusion layer and the electrode extraction layer are connected with a drain electrode. When an excessive positive surge voltage is applied to a source electrode, a parasitic diode that makes a current path including the diffusion layer and the electrode extraction layer is turned on to shunt an ESD current from the source electrode to the drain electrode, in addition to other parasitic diodes included in a conventional structure.

7 Claims, 5 Drawing Sheets

|  | SEMICONDUCTOR DEVICE 120 | SEMICONDUCTOR DEVICE 125 | SEMICONDUCTOR DEVICE 20 | SEMICONDUCTOR DEVICE 30 |
|---|---|---|---|---|
| ESD WITHSTAND VOLTAGE (V) | 130 | 180 | 230 | 300 |

SEMICONDUCTOR DEVICE

CROSS-REFERENCE OF THE INVENTION

This application claims priority from Japanese Patent Application No. 2006-268227, the content of which is incorporated herein by reference in its entirety.

BACKGROUND OF THE INVENTION

1. Field of the Invention

This invention relates to a semiconductor device, specifically to a transistor structure to improve an ESD (Electro Static Discharge) withstand voltage.

2. Description of the Related Art

A DMOS (Diffused MOS) type MOS transistor has a high source-drain withstand voltage and a high gate withstand voltage, and is used in various kinds of drivers such as an LCD driver, power supply circuits and the like. In particular, a high withstand voltage MOS transistor having a low ON resistance as well as a high drain withstand voltage (BVds) is required in recent years.

FIG. 6 is a cross-sectional view showing a conventional N-channel type high withstand voltage MOS transistor. An epitaxial layer 101 of $N^{--}$-type is formed in a surface of a P-type semiconductor substrate 100. An N-type buried layer 102 is formed at an interface between a bottom of the epitaxial layer 101 and the semiconductor substrate 100. The epitaxial layer 101 is divided into a plurality of isolated regions with insulating isolation layers. The insulating isolation layer is composed of contiguously disposed P-type impurity doped layers of an upper isolation layer 103 and a lower isolation layer 104.

A gate insulation film 105 and a thick field insulation film 106 are formed on the epitaxial layer 101. A gate electrode 107 is formed on the gate insulation film 105 and on an adjacent portion of the field insulation film 106. A P-type body layer 108 is formed in a surface of the epitaxial layer 101. A high impurity concentration ($N^+$) source layer 109 is formed in a surface of the body layer 108 adjacent one end of the gate electrode 107.

A high impurity concentration ($N^+$) drain layer 110 is formed in the surface of the epitaxial layer 101 separated from the other end of the gate electrode 107. A low impurity concentration ($N^-$) drain layer 111 that is lower in impurity concentration and deeper in diffusion depth than the high impurity concentration drain layer 110 is formed in a region extending from beneath the gate electrode 107 to beneath the high impurity concentration drain layer 110. The high impurity concentration drain layer 110 is formed in the low impurity concentration drain layer 111.

An electric potential fixing layer 112 into which P-type impurities are implanted is formed in the surface of the body layer 108 adjacent the source layer 109. The electric potential fixing layer 112 is a layer to fix an electric potential of the body layer 108.

An interlayer insulation film 113 is formed over entire surface of the semiconductor substrate 100. Contact holes reaching the gate electrode 107, the source layer 109, the electric potential fixing layer 112 and the high impurity concentration drain layer 110 are formed in the interlayer insulation film 113. A source electrode 114 and a drain electrode 115 are formed on the corresponding contact holes respectively. The source electrode 114 is usually connected to a VSS wiring (ground voltage). Note that the contact hole reaching the gate electrode 107 and a metal layer in the contact hole are omitted in FIG. 6.

A surface region of the body layer 108 between the epitaxial layer 101 and the source layer 109 makes a channel region CH. The semiconductor substrate 100 is not connected with the source electrode 114 and is not grounded.

When an excessive positive surge voltage is applied to the source electrode 114 (or an excessive negative surge voltage is applied to the drain electrode 115) of the conventional semiconductor device 120, a parasitic diode 121, which is composed of the P-type body layer 108 as an anode and the N-type drain layer as a cathode as shown in FIG. 6, is turned on and thereby an ESD current flows from the source electrode 114 to the drain electrode 115. Also, a parasitic diode 122, which makes a current path from the body layer 108 through the buried layer 102 to the drain electrode 115, is turned on.

Furthermore, when the semiconductor substrate 100 is connected with the VSS wiring (ground wiring) similar to the source electrode 114, a parasitic diode 123, which is composed of the P-type semiconductor substrate 100 as an anode and the N-type buried layer 102 and the drain layer as a cathode, is turned on and thereby a current flows to the drain electrode 115. The transistor structure, in which the parasitic diode 123 is turned on in addition to the parasitic diodes 121 and 122 as described above, is called a semiconductor device 125.

Technologies described above are disclosed in Japanese Patent Application Publication No. 2004-39774.

With the transistor structure described above, however, there is a problem that an electrostatic discharge damage is caused between the source and the drain when the excessive positive surge voltage is applied to the source electrode (or an excessive negative surge voltage is applied to the drain electrode). That is, an electrostatic discharge withstand voltage (hereafter referred to as ESD withstand voltage) is not enough with the conventional structure. For example, according to typical electrostatic discharge damage tests based on a machine model (MM) conducted by the inventor, the ESD withstand voltage of the semiconductor device 120 is about 130 volts and the ESD withstand voltage of the semiconductor device 125 is about 180 volts as shown in FIG. 4, which are not high enough. Therefore, this invention is directed to offering a transistor structure that improves the ESD withstand voltages.

SUMMARY OF THE INVENTION

The invention offers a semiconductor device having a semiconductor substrate of a first conductivity type, a semiconductor layer of a second conductivity type formed on the semiconductor substrate, a body layer of the first conductivity type formed in a surface of the semiconductor layer, a channel region disposed in the body layer, a source layer of the second conductivity type formed in a surface of the body layer, a gate electrode formed on a portion of the body layer through a gate insulation film, a drain layer of the second conductivity type formed in the surface of the semiconductor layer, an insulating isolation layer of the first conductivity type that divides the semiconductor substrate into a plurality of isolated regions and insulates neighboring isolated regions from each other and a diffusion layer of the second conductivity type that is connected with the drain electrode.

DETAILED DESCRIPTION OF THE INVENTION

Figure 1:
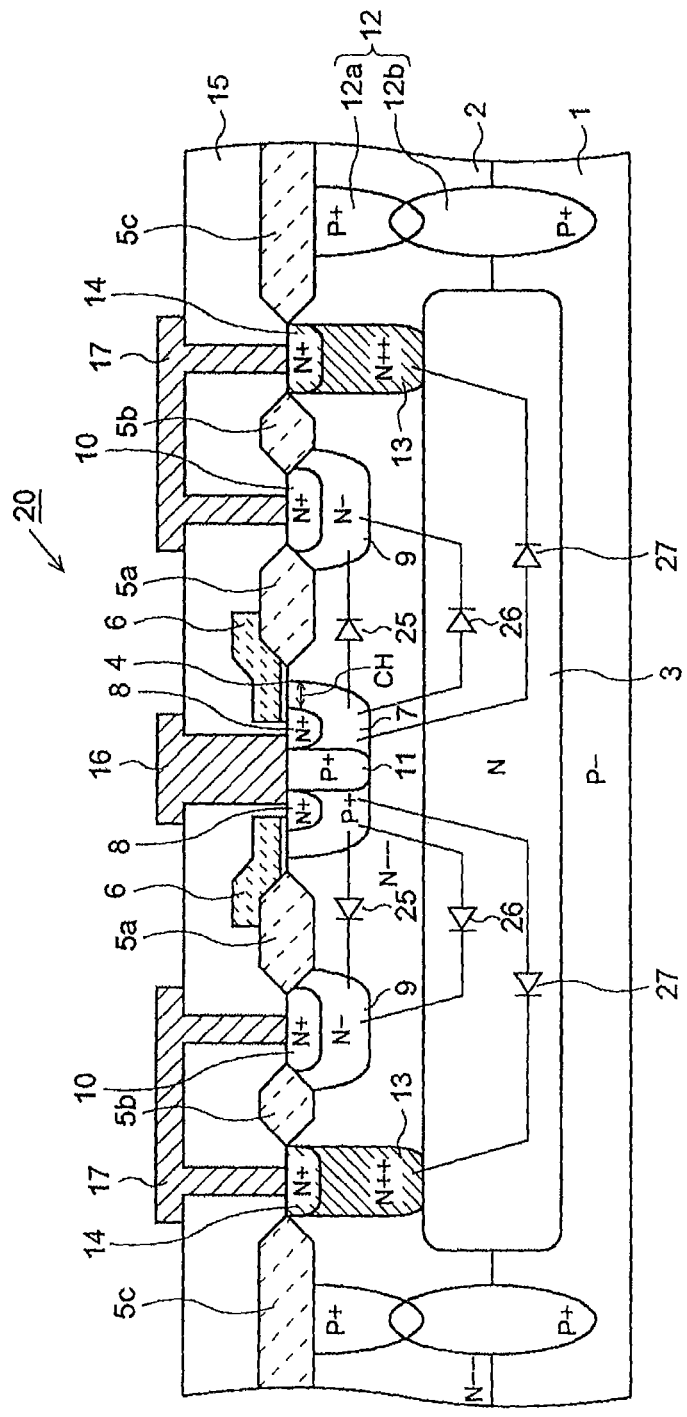
FIG. 1 is a cross-sectional view showing a semiconductor device according an embodiment of this invention.
Figure 2:
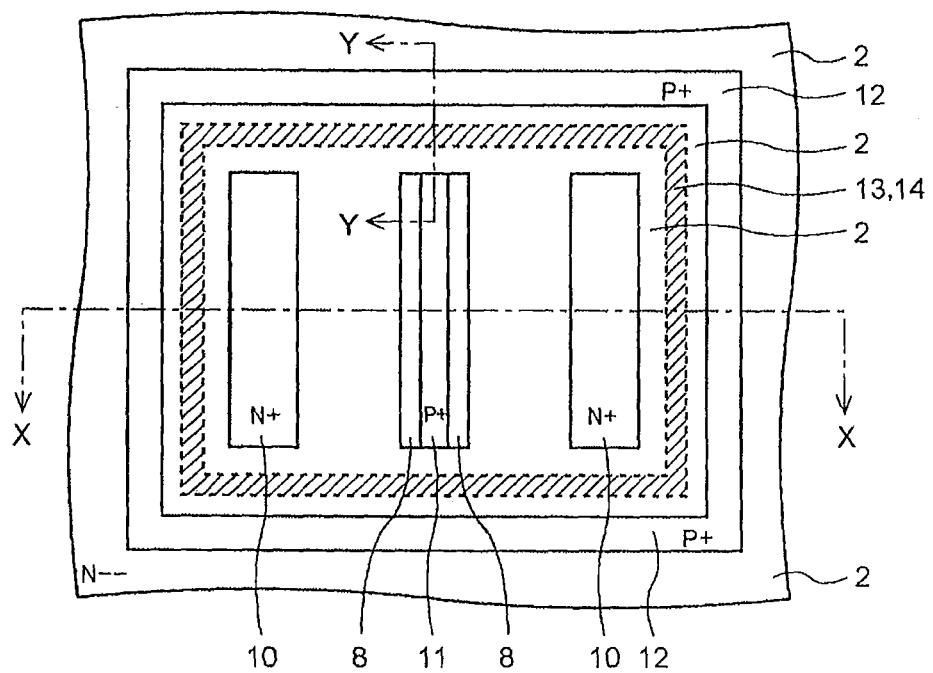
FIG. 2 is a plan view showing the semiconductor device according to the embodiment of this invention.
Figures 3, 4:
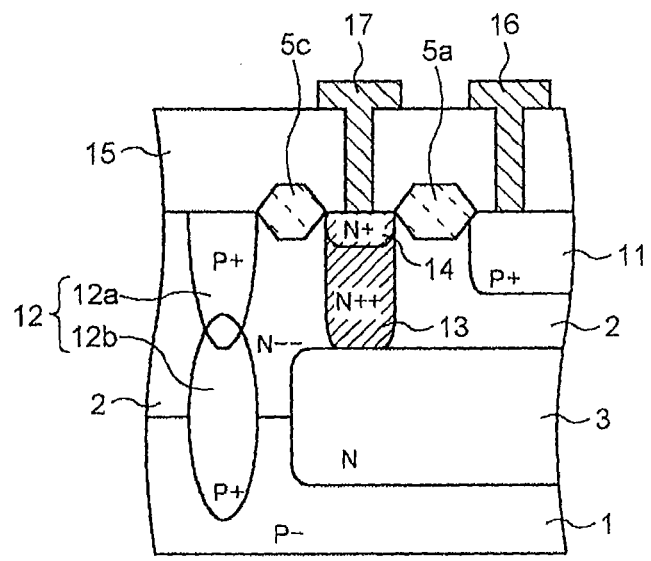
FIG. 3 is a cross-sectional view to explain the semiconductor device according the embodiment of this invention.
FIG. 4 is a table showing ESD withstand voltages of the semiconductor devices according the embodiment of this invention and those of conventional structures.

A semiconductor device according to an embodiment of this invention will be described hereafter referring to the drawings. FIG. 1 is a cross-sectional view showing the semiconductor device according the embodiment. FIG. 2 is a plan view of the semiconductor device according to the embodiment. FIG. 1 corresponds to a cross-sectional view of a section X-X shown in FIG. 2. FIG. 3 is a cross-sectional view showing a section Y-Y shown in FIG. 2. Note that some components such as field insulation films 5a, 5b and 5c, an interlayer insulation film 15, a source electrode 16 and a drain electrode 17 are omitted and not shown in FIG. 2.

An epitaxial layer 2 of an $N^{--}$-type is formed in a surface of a semiconductor substrate 1 of P-type. A buried layer 3 of N-type is formed at an interface between a bottom of the epitaxial layer 2 and the semiconductor substrate 1. The epitaxial layer 2 and the buried layer 3 are formed by implanting a high dose of N-type impurities such as phosphorous ions $P^+$ into the semiconductor substrate 1 followed by epitaxial growth. The buried layer 3 has approximately the same area as one of isolated regions that will be described later. A sheet resistance of the epitaxial layer 2 is about 1000-2000Ω/□, for example, and a sheet resistance of the buried layer 3 is about 30Ω/□, for example.

It is noted that conductivity types such as $P^+$, P and $P^-$ belong in one general conductivity type and conductivity types such as $N^+$, N and $N^-$ belong in another general conductivity type.

A gate insulation film 4, thick field insulation films 5a, 5b and 5c are formed on predetermined regions of the epitaxial layer 2. The gate insulation film 4 is made of a silicon oxide film formed by a thermal oxidation method, a CVD (Chemical Vapor Deposition) method or the like, for example. The thickness of the gate insulation film 4 varies depending on a target withstand voltage, and is about 15-200 nm, for example.

The field insulation films 5a, 5b and 5c are formed using a LOCOS (Local Oxidation of Silicon) method, for example. While a field insulation film is formed usually for device isolation, the field insulation film 5a in this semiconductor device is used for enhancing a withstand voltage of a transistor. That is, the field insulation film 5a serves to relax an electric field in a region where it is formed and is able to enhance the withstand voltage. The thickness of the field insulation films 5a, 5b and 5c varies depending on the target withstand voltage, and is about 300-600 nm, for example. Note that the forming of the field insulation film is not limited to the LOCOS method, and other device isolation methods including an STI (Shallow Trench Isolation) method, for example, may be used. The field insulation films 5a, 5b and 5c are thicker than the gate insulation film 4.

A gate electrode 6 is formed on the gate insulation film 4 and extending onto an adjacent portion of the field insulation film 5a. The gate electrode 6 is formed by forming a conductive layer made of aluminum (Al), aluminum alloy, copper (Cu), polysilicon or the like by sputtering, plating, the CVD method or other film forming method, followed by selectively etching the conductive layer using a photoresist layer (not shown) as a mask. Its thickness is about 300 nm, for example.

In a surface region of the epitaxial layer 2, there is formed a P-type impurity doped ($P^+$) body layer 7 that includes a channel region CH. A surface region of the body layer 7 between the epitaxial layer 2 and the source layer 8 makes the channel region CH. A length of the channel region CH varies depending on a design, and is about 0.5 μm, for example. The body layer 7 is formed by implanting boron ions ($B^+$) with an acceleration energy of 40 KeV and at a dose of $1\times10^{14}/cm^2$ followed by a heat treatment.

A high impurity concentration ($N^+$) source layer 8 is formed in the surface of the body layer 7 adjacent one end of the gate electrode 6. A low impurity concentration ($N^-$) drain layer 9 that is lower in impurity concentration than the epitaxial layer 2 is formed in the surface of the epitaxial layer 2. Also, a high impurity concentration ($N^+$) drain layer 10 is formed in a surface of the low impurity concentration drain layer 9. The high impurity concentration drain layer 10 is separated from the one end of the gate electrode 6 and adjacent the field insulation films 5a and 5b.

The low impurity concentration drain layer 9 may be formed in a region from beneath the gate electrode 6 to beneath the high impurity concentration drain layer 10. The low impurity concentration drain layer 9 is diffused deeper than the high impurity concentration drain layer 10.

The high impurity concentration source layer 8 and the high impurity concentration drain layer 10 are formed by implanting N-type impurities such as phosphorous ions ($P^+$) with an acceleration energy of 100 KeV and at a dose of $1\times10^{15}/cm^2$ followed by a heat treatment. The low impurity concentration drain layer 9 is formed by implanting N-type impurities such as phosphorous ions ($P^+$) with an acceleration energy of 150 KeV and at a dose of $1\times10^{12}/cm^2$ followed by a heat treatment.

An electric potential fixing layer 11 into which P-type impurities are implanted is formed in the surface of the body layer 7 adjacent the high impurity concentration source layer 8. The electric potential fixing layer 11 is a layer to fix an electric potential of the body layer 7. The electric potential fixing layer 11 is formed by implanting P-type impurities such as boron ions ($B^+$) with an acceleration energy of 40 KeV and at a dose of $1\times10^{14}/cm^2$ followed by a heat treatment.

The epitaxial layer 2 is divided into a plurality of isolated regions by insulating isolation layers 12 as shown in FIG. 1 and FIG. 2. The insulating isolation layer 12 is composed of a P-type impurity doped upper isolation layer 12a and a P-type impurity doped lower isolation layer 12b that overlap one another in the epitaxial layer 2 to form a contiguous structure. The upper isolation layer 12a is formed by diffusing P-type impurities such as boron (B+) downward from an upper surface of the epitaxial layer 2. On the other hand, the lower isolation layer 12b is formed by diffusing P-type impurities such as boron (B+) upward from the semiconductor substrate 1. Neighboring isolated regions are insulated from each other with the insulating isolation layer 12.

A high impurity concentration ($N^{++}$) diffusion layer 13 doped with N-type impurities is formed in the surface of the epitaxial layer 2 between the high and low impurity concentration drain layers 9 and 10 and the insulating isolation layer 12. An electrode extraction layer 14 is formed in a surface of the high impurity concentration diffusion layer 13. The high impurity concentration diffusion layer 13 and the electrode extraction layer 14 together make a diffusion layer to enhance the ESD withstand voltage in the embodiment of this invention. This point will be described later. The electrode extraction layer 14 makes a contact with a drain electrode 17 that will be described later and has a slightly lower impurity concentration than the high impurity concentration diffusion layer 13.

The high impurity concentration diffusion layer 13 and the electrode extraction layer 14 are also adjacent the field insulation films 5b and 5c in this embodiment. The high impurity concentration diffusion layer 13 diffuses deeper than the low impurity concentration drain layer 9. It is preferable for enhancing the ESD withstand voltage that a bottom of the high impurity concentration diffusion layer 13 touches a portion of the buried layer 3. Because it reduces a resistance of a current path going through the high impurity concentration diffusion layer 13, the electrode extraction layer 14 and a parasitic diode, and improves ESD current conduction characteristics, as will be described later.

Also, it is preferable for enhancing the ESD withstand voltage that the high impurity concentration diffusion layer 13 and the electrode extraction layer 14 are formed along a periphery of one of the isolated regions, similar to the insulating isolation layer 12, as shown in FIG. 2. Because it increases a cross-sectional area of the current path and is effective in enhancing the ESD withstand voltage.

The high impurity concentration diffusion layer 13 is formed between the electric potential fixing layer 11 and the insulating isolation layer 12, as shown in FIG. 2 and FIG. 3. With the structure described above, it is made possible to prevent formation of a parasitic PNP bipolar transistor composed of the P-type electric potential fixing layer 11, N-type epitaxial layer 2 and the P-type insulating isolation layer 12 and the semiconductor substrate 1.

The high impurity concentration diffusion layer 13 is formed by implanting N-type impurities such as phosphorous ions ($P^+$) with an acceleration energy of 100 KeV and at a dose of $1 \times 10^{15}/cm^2$ followed by a heat treatment. It is preferable for enhancing the ESD withstand voltage that its sheet resistance is about 50Ω/□, for example, and is considerably lower compared with the sheet resistance of the epitaxial layer 2.

The electrode extraction layer 14 is formed by implanting N-type impurities such as phosphorous ions ($P^+$) with an acceleration energy of 100 KeV and at a dose of $1 \times 10^{15}/cm^2$ followed by a heat treatment. Its sheet resistance is about 60Ω/□, for example. It is also possible that the electrode extraction layer 14, the high impurity concentration source layer 8 and the high impurity concentration drain layer 10 are formed simultaneously in the same process.

The interlayer insulation film 15, which is a BPSG (Boro-Phospho Silicate Glass) film or a silicon nitride film formed by the CVD method, for example, is formed all over the semiconductor substrate 1. A contact hole that leads to the high impurity concentration source layer 8 and the electric potential fixing layer 11 is formed in the interlayer insulation film 15, and the source electrode 16 is formed on the contact hole. Although the source electrode 16 is made to be a common electrode to the high impurity concentration source layer 8 and the electric potential fixing layer 11, an electrode may be formed for each of them individually.

Also, contact holes leading to the high impurity concentration drain layer 10 and the electrode extraction layer 14 are formed in the interlayer insulation film 15. The drain electrode 17 is formed on the contact holes. The source electrode 16 and the drain electrode 17 are made of metal layers such as aluminum. The source electrode 16 is connected to a VSS wiring (usually at the ground voltage) in the embodiment. Note that the contact hole reaching the gate electrode 6 and a metal layer in the contact hole are omitted and not shown in the drawing.

In this embodiment, the semiconductor substrate 1 is not connected with the source electrode 16 and is not grounded.

The DMOS transistor structured as described above is called a semiconductor device 20. When an excessive positive surge voltage is applied to the source electrode 16 (or an excessive negative surge voltage is applied to the drain electrode 17) of the semiconductor device 20, a parasitic diode 25, which is composed of the P-type body layer 7 as an anode and the N-type drain layer as a cathode as shown in FIG. 1, is turned on and thereby an ESD current flows from the source electrode 16 to the drain electrode 17. Also, a parasitic diode 26, which makes a current path from the body layer 7 through the epitaxial layer 2 and the buried layer 3 to the drain electrode 17, is turned on.

In addition, the semiconductor device 20 according to the embodiment is provided with the high impurity concentration diffusion layer 13 and the electrode extraction layer 14. Thus, a parasitic diode 27, which makes a current path from the body layer 7 through the epitaxial layer 2, the buried layer 3, the high impurity concentration diffusion layer 13 and the electrode extraction layer 14 to the drain electrode 17, is turned on.

In the conventional structure (Refer to FIG. 6.), when the semiconductor substrate 100 is not connected with the source electrode 114, the ESD current flows utilizing the parasitic diodes 121 and 122 that make the current paths similar to those made by the parasitic diodes 25 and 26. In the semiconductor device 20 according to the embodiment, on the other hand, the ESD current is shunted to the drain electrode 17 by additionally turning on the parasitic diode 27.

Figure 6:
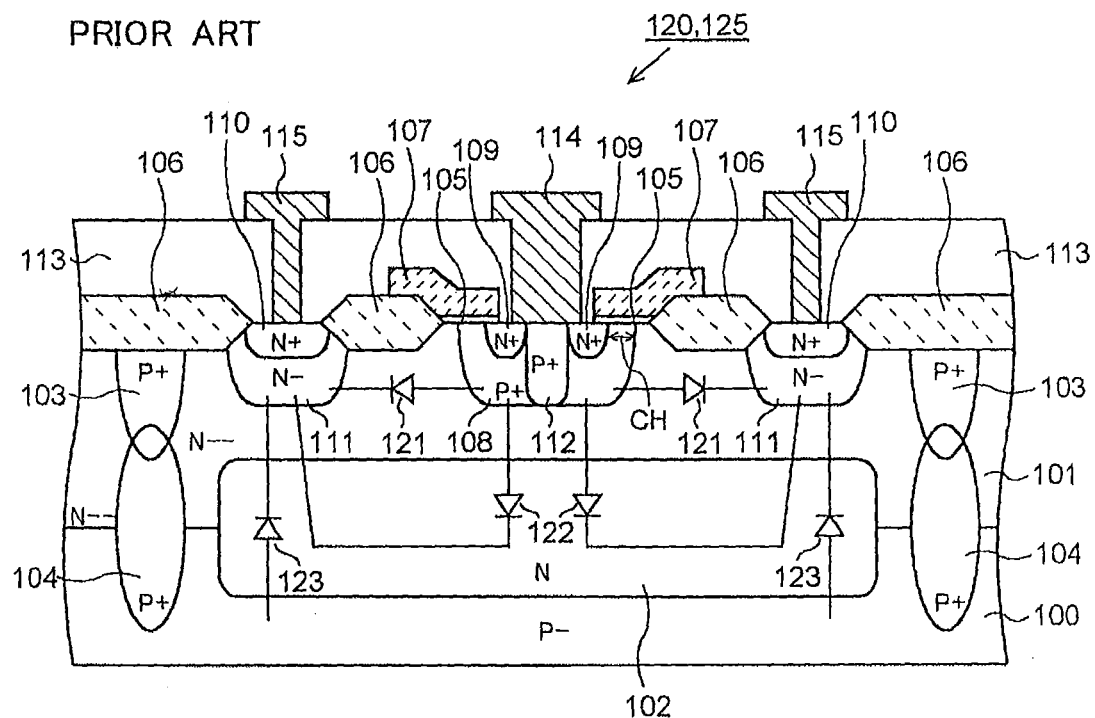
FIG. 6 is a cross-sectional view showing a conventional semiconductor device.

The ESD withstand voltage of the semiconductor device 20 according to the embodiment is compared with the ESD withstand voltages of the conventional semiconductor devices 120 and 125 shown in FIG. 6. FIG. 4 shows an example of results of the tests on the ESD withstand voltages based on a machine model for each of the semiconductor devices.

FIG. 4 shows that the ESD withstand voltages for the conventional structure (semiconductor devices 120 and 125) are 130 and 180 V, and that the ESD withstand voltage for the semiconductor device 20 is improved to 230 V. In particular, it is considered that the parasitic diode 27 significantly contributes to the improvement in the ESD withstand voltage. Because its low impedance and large area serve to shunt the current effectively.

Next, a case in which the semiconductor substrate 1 is connected with the source electrode 16 in the semiconductor device 20 will be explained. The semiconductor device in this case is called a semiconductor device 30, as shown in FIG. 5.

Figure 5:
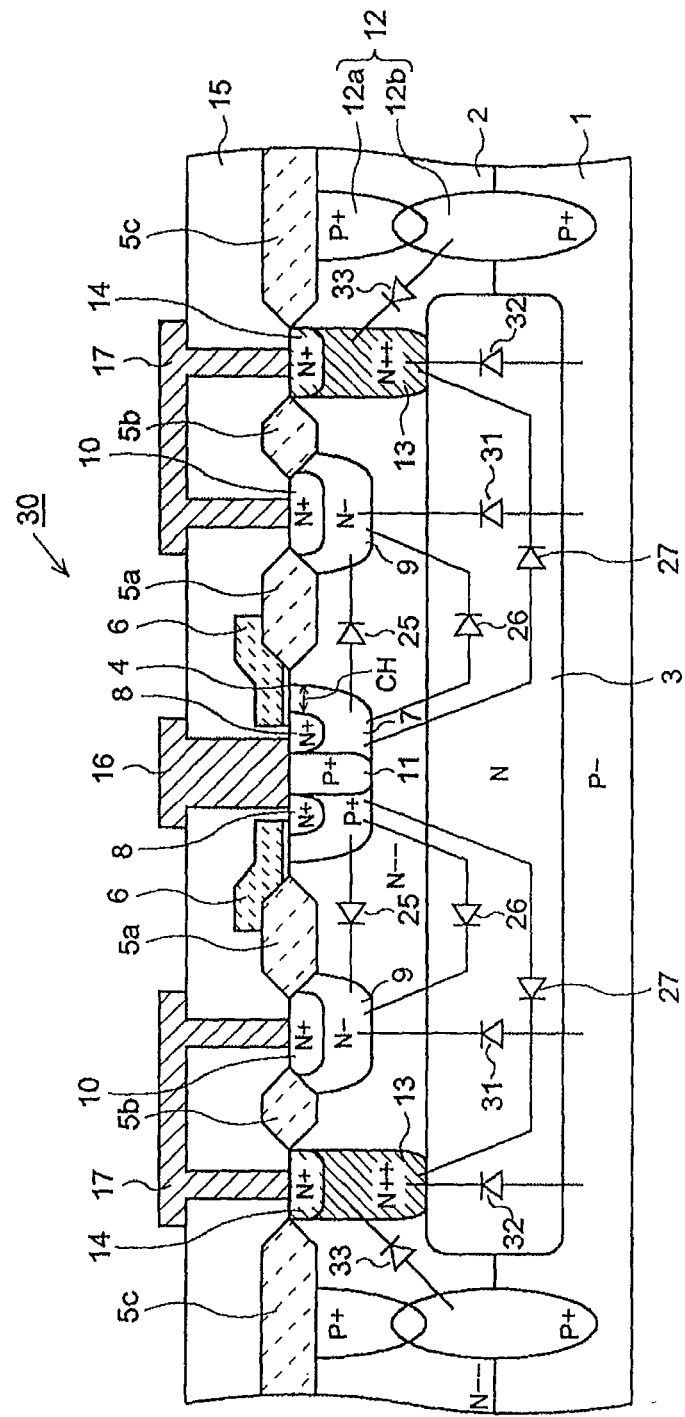
FIG. 5 is a cross-sectional view to explain the semiconductor device according the embodiment of this invention.

When an excessive positive surge voltage is applied to the source electrode 16 of the semiconductor device 30, the parasitic diodes 25, 26 and 27 are turned on as shown in FIG. 5, as in the case of the semiconductor device 20. In addition, a parasitic diode 31, which is composed of the semiconductor substrate 1 as an anode and the buried layer 3, the epitaxial layer 2 and the drain layers (the low impurity concentration drain layer 9 and the high impurity concentration drain layer 10) as a cathode, is turned on and thereby an ESD current is shunted to the drain electrode 17. Further, a parasitic diode 32, which makes a current path from the semiconductor substrate 1 through the buried layer 3, the high impurity concentration diffusion layer 13 and the electrode extraction layer 14 to the drain electrode 17, is turned on. Furthermore, a parasitic diode 33, which makes a current path from the semiconductor substrate 1 through the insulating isolation layer 12, the epitaxial layer 2, the high impurity concentration diffusion layer 13 and the electrode extraction layer 14 to the drain electrode 17, is turned on.

In the conventional structure (Refer to FIG. 6.), when the semiconductor substrate 100 is connected with the source electrode 114, the ESD current flows utilizing the parasitic diodes 121, 122 and 123 that make the current paths similar to those made by the parasitic diodes 25, 26 and 31. In the semiconductor device 30, on the other hand, the ESD current is shunted to the drain electrode 17 by additionally turning on the parasitic diodes 27, 32 and 33. In this embodiment, the parasitic diodes 27, 32 and 33 that have the high impurity concentration diffusion layer 13 and the electrode extraction layer 14 in their current paths have good characteristics as diodes, since the high impurity concentration diffusion layer 13 has a low sheet resistance. In particular, it is considered that the parasitic diodes 27 and 32 significantly contribute to the improvement in the ESD withstand voltage.

While the ESD withstand voltages of the conventional structure (semiconductor devices 120 and 125) are 130 and 180 V, the ESD withstand voltage of the semiconductor device 30 is dramatically improved to 300 V, as shown in FIG. 4. The test results prove that the parasitic diodes 27, 32 and 33 having the high impurity concentration diffusion layer 13 and the electrode extraction layer 14 in their current paths contribute to the improvement in the ESD withstand voltage.

It is apparent that this invention is not limited to the embodiment described above and may be modified within the scope of the invention. For example, while the bottom of the high impurity concentration diffusion layer 13 makes contact with the buried layer 3, it is also possible to separate them from each other. It is conceivable that further improvement in the ESD withstand voltage would be realized by modifying the sheet resistance, the depth or the location of the high impurity concentration diffusion layer 13. Although there is formed the field insulation film 5a under the portion of the gate electrode 6, it is possible to change the design of the structure so that the field insulation film 5a is not formed. This invention may be applied to a P-channel type DMOS transistor which has the same structure as the N-channel type DMOS transistor described above with only difference in conductivity type, as well-known to those skilled in the art. It is also well-known that various kinds of devices can be disposed in the isolated region.

The semiconductor device according to the embodiment of this invention is provided with the diffusion layer that is other than the drain layer, and of the same conductivity type as the drain layer, and connected with the drain electrode. It is structured so that the ESD current is shunted through the path including the diode and the diffusion layer when the abnormal voltage is applied. That is, the path to shunt the ESD current to outside is added to the conventional structure. As a result, the ESD withstand voltage is improved.

What is claimed is:

1. A semiconductor device comprising:
   a semiconductor substrate of a first general conductivity type;
   a semiconductor layer of a second general conductivity type formed on the semiconductor substrate;
   a body layer of the first general conductivity type formed in a surface portion of the semiconductor layer, the body layer comprising a channel region;
   a source layer of the second general conductivity type formed in a surface portion of the body layer;
   a gate electrode disposed on a portion of the body layer;
   a gate insulation film disposed between the channel region and the gate electrode;
   a drain layer of the second general conductivity type formed in the surface portion of the semiconductor layer;
   an insulating isolation layer of the first general conductivity type that isolates a region of the semiconductor layer in which the body layer is formed from other region of the semiconductor layer;
   a drain electrode electrically connected to the drain layer; and
   a diffusion layer of the second general conductivity type electrically connected to the drain electrode and physically separated from the drain layer,
   wherein the drain layer is disposed between the source layer and the diffusion layer.

2. The semiconductor device of claim 1, further comprising a buried layer of the second general conductivity type formed at an interface between the semiconductor substrate and the semiconductor layer, wherein the diffusion layer is physically in contact with the buried layer.

3. The semiconductor device of claim 1, further comprising a source electrode, wherein the source electrode is electrically connected to the semiconductor substrate.

4. The semiconductor device of claim 1, wherein the diffusion layer is disposed between the body layer and the insulating isolation layer so as to surround the body layer.

5. The semiconductor device of claim 1, further comprising an electric potential fixing layer of the first general conductivity type formed in the body layer and is adjacent the source layer, wherein the diffusion layer is disposed between the electric potential fixing layer and the insulating isolation layer.

6. The semiconductor device of claim 1, further comprising a thick insulation film that is thicker than the gate insulation film and disposed on the semiconductor layer, wherein the gate electrode extends over a portion of the thick insulation film.

7. The semiconductor device of claim 1, wherein in plan view of the semiconductor device the drain layer and the diffusion layer do not overlap.

* * * * *